United States Patent
Tanaka et al.

[11] Patent Number: 5,255,229
[45] Date of Patent: Oct. 19, 1993

[54] DYNAMIC RANDOM ACCESS MEMORY INCLUDING STRESS TEST CIRCUITRY

[75] Inventors: Hiroaki Tanaka, Yokohama; Masaru Koyanagi, Tokyo, both of Japan

[73] Assignee: Kabushiki Kaisha Toshiba, Kawasaki, Japan

[21] Appl. No.: 813,578

[22] Filed: Dec. 26, 1991

[30] Foreign Application Priority Data

Dec. 27, 1990 [JP] Japan .................. 2-418761

[51] Int. Cl.⁵ .............................. G11C 7/02
[52] U.S. Cl. .................. 365/201; 365/203; 365/206
[58] Field of Search ............. 365/201, 203, 206; 307/443

[56] References Cited

U.S. PATENT DOCUMENTS

| | | | |
|---|---|---|---|
| 4,458,338 | 7/1984 | Giebel et al. | 365/201 |
| 4,608,666 | 8/1986 | Uchida | 365/189.01 |
| 4,751,679 | 6/1988 | Dehganpour | 365/201 |
| 4,860,261 | 8/1989 | Kreifels et al. | 365/201 |
| 4,870,618 | 9/1989 | Iwashita | 365/201 |
| 4,922,453 | 5/1990 | Hidaka | 365/63 |

FOREIGN PATENT DOCUMENTS

| | | |
|---|---|---|
| 3932442A1 | 3/1990 | Fed. Rep. of Germany . |
| 59-500840 | 4/1983 | Japan . |
| 60-235455 | 5/1984 | Japan . |

Primary Examiner—Eugene R. LaRoche
Assistant Examiner—Christopher R. Glembocki
Attorney, Agent, or Firm—Banner, Birch, McKie & Beckett

[57] ABSTRACT

A dynamic random access memory according to the present invention comprises a voltage stress test pad to which a stress voltage is externally applied when a voltage stress test is carried out, transistors which turn off when the stress voltage is not applied to the voltage stress test pad and which, when the stress voltage is applied thereto, transmit the stress voltage to more word lines than those selected in response to an external address signal in a normal operation mode, and a noise killer control circuit for turning off a noise killer circuit connected to a word line to which the stress voltage is applied when the voltage stress test is carried out.

25 Claims, 1 Drawing Sheet

DYNAMIC RANDOM ACCESS MEMORY INCLUDING STRESS TEST CIRCUITRY

BACKGROUND OF THE INVENTION

1. Field of the Invention

The present invention relates to a dynamic random access memory (DRAM) and, more particularly, to a DRAM having a stress testing device for applying a voltage stress, e.g., when defect screening is performed in a wafer state (i.e., the DRAM which is not separated from a semiconductor wafer.).

2. Description of the Related Art

In a manufacturing process of semiconductor devices, in general, products are sorted into good ones and bad ones by a die-sorting test after a process for producing semiconductor wafers, and after the good ones are accommodated in packages, thereby obtaining their final form. The packaged products are screened. As a method of screening, burn-in is employed in many cases, in which electric-field acceleration and temperature acceleration can be simultaneously performed.

Published Unexamined Japanese Patent Application (Kokai) No. 3-35491 (T. Furuyama), which corresponds to U.S. patent application Ser. No. 544,614, discloses a semiconductor memory suitable for performing screening of memory chip regions on a semiconductor wafer, using a probe card and a prober before the die sort test. This screening can be performed efficiently in a short period of time.

In a commonly-used semiconductor memory, a noise killer MOS transistor is connected between one end of a word line and a ground node. The noise killer transistor prevents the voltage potential of a non-selective word line from entering a floating state during a precharge period or an active period in a normal operation mode, and prevents the level of a word line from exceeding the threshold voltage of a transfer gate of a memory cell because of noise or the like during either of these periods. This prevents data in memory cells from being destroyed.

If the noise killer transistor is in the ON-state when all word lines are selected and voltage stress is applied to the word lines to perform a screening, a through-current will flow from a voltage stress application power source to the ground node via the word line and noise killer transistor. Thus, it is desirable to provide a control means for controlling the noise killer transistor in order to apply the voltage stress to the word lines simultaneously when a voltage stress test is carried out on a DRAM.

SUMMARY OF THE INVENTION

It is accordingly an object of the present invention to provide a dynamic random access memory capable of applying voltage stress to all word lines or more word lines than those selected in a normal operation mode when a voltage stress test is carried out and preventing a through-current from flowing from a voltage stress application power source to a ground node via the word line and a noise killer circuit.

To attain the above object, a dynamic random access memory according to the present invention comprises:

a memory cell array having a plurality of DRAM cells arranged in rows and columns, a plurality of word lines for selecting the DRAM cells of the same row, and a plurality of bit lines for transmitting data between the DRAM cells of the same column;

a noise killer circuit connected between said word line and a ground potential;

a voltage stress test terminal to which a stress voltage is externally applied when a voltage stress test for the memory cell array is carried out;

stress voltage transmission circuit which is turned off when the stress voltage is not applied to the voltage stress test terminal and which transmits the stress voltage to more word lines than those selected in response to an address signal in a normal operation mode when the stress voltage is applied to the voltage stress terminal; and noise killer control circuit for turning off the noise killer circuit connected to the corresponding word line to which the stress voltage is applied when the voltage stress test is carried out.

Since the dynamic random access memory comprises the voltage stress test terminal and stress voltage transmission circuit, voltage stress can be applied in a direct-current fashion to all word lines or a number of word lines which is greater than a number of word lines selected in the normal operation mode when a screening of wafers is performed. Therefore, the screening can remarkably be improved in efficiency.

Since the dynamic random access memory comprises the noise killer control circuit, when the voltage stress is applied to the word lines as in the above case, the noise killer circuit connected to the corresponding word line is turned off. Therefore, no through current flows from the voltage stress application power source to the ground node via the word line and noise killer circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawing, which is incorporated in and constitutes a part of the specification, illustrates presently preferred embodiments of the invention and, together with the general description given above and the detailed description of the preferred embodiments given below, serves to explain the principles of the invention.

DETAILED DESCRIPTION OF THE PREFERRED EMBODIMENT

Figure 1:
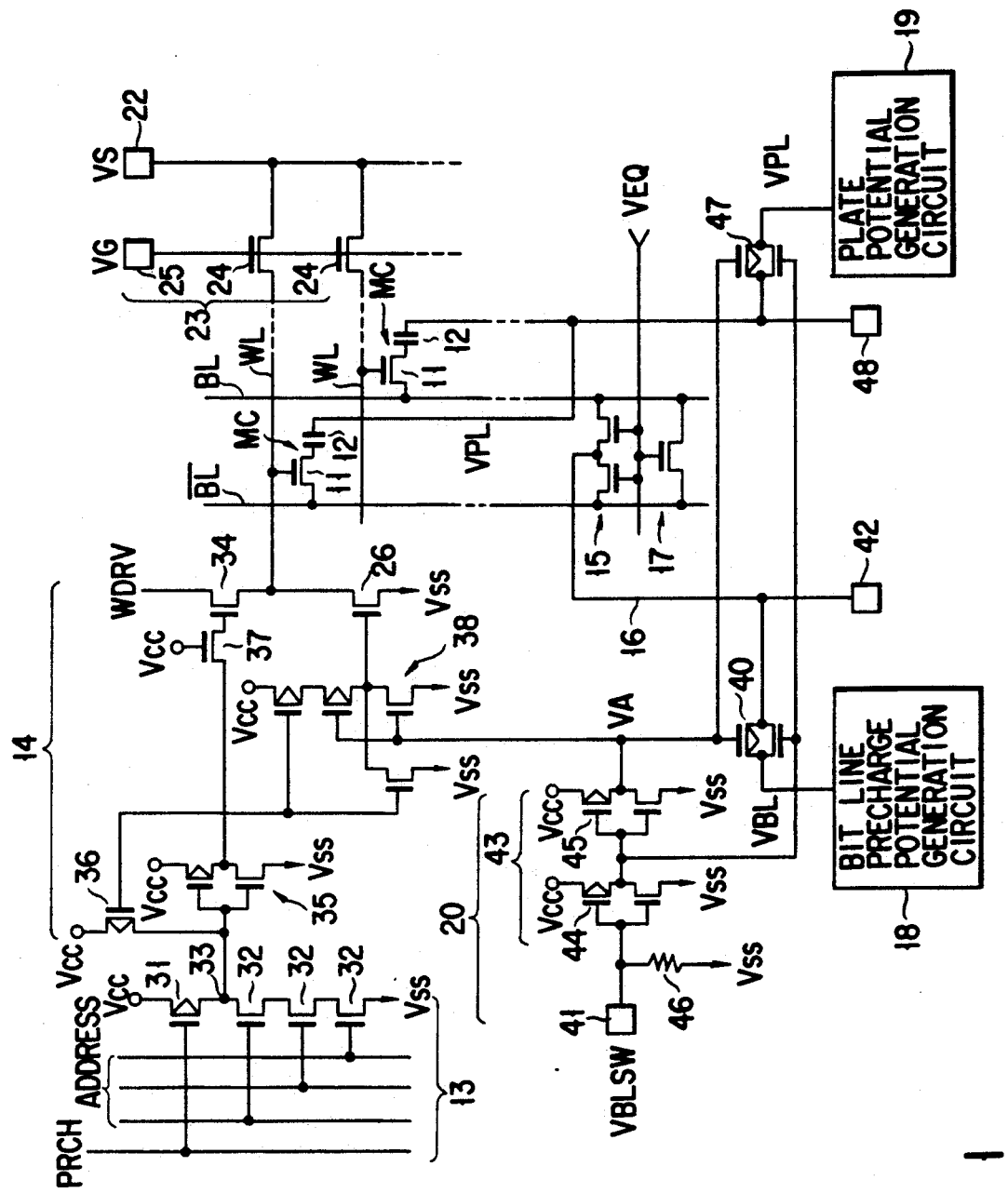
FIG. 1 is a circuit diagram showing part of a dynamic random access memory according to an embodiment of the present invention.

An embodiment of the present invention will be described in detail when taken in conjunction with the accompanying drawing.

FIG. 1 partly shows a DRAM circuit and a pad formed on a chip of a DRAM according to an embodiment of the present invention.

A memory cell array of the DRAM includes a plurality of dynamic memory cells (DRAM cells) MC (two of which are shown) arranged in rows and columns, a plurality of word lines WL (two of which is shown) for selecting the DRAM cells of the same row, and a plurality of bit lines (complementary two BL and $\overline{BL}$ of which are shown) for transferring data between the memory cells of the same column. In each of the memory cells MC, a transfer gate MOS transistor (memory cell transistor) 11 and data storing capacitor 12 are connected in series to each other. Each of the word lines WL is connected to the gates of memory cell transistors 11 of memory cells MC on the same row of the memory cell array. The bit line BL is connected to the drains of memory cell transistors 11 of memory cells MC on the same column of the memory cell array, and the bit line $\overline{BL}$ is connected to the drains of memory cell transistors 11 of memory cells MC on another column of the memory cell array.

In FIG. 1, reference numeral 13 denotes a word line selection circuit (row decoder) for outputting a word line selection signal in response to an address signal input externally or internally, 14 denotes a word line driving circuit, 15 denotes a bit line precharge circuit connected between the bit lines BL and $\overline{BL}$ and bit line precharge power line 16 and controlled by bit line precharge signal VEQ, 17 denotes a bit line equalizing circuit connected between the bit lines BL and $\overline{BL}$ and controlled by bit line equalizing signal (precharge signal) VEQ, 18 denotes a bit line precharge potential generation circuit for generating a bit line precharge voltage VBL (usually Vcc/2) and applying the voltage to all bit line precharge power lines 16, and 19 denotes a plate potential generation circuit for generating a capacitor plate potential VPL (usually Vcc/2) and applying the potential to capacitor plates of all the memory cells.

In FIG. 1, reference numeral 22 indicates a stress voltage application terminal which is formed of a bonding pad and to which a stress voltage VS is externally applied when a voltage stress test is carried out, 24 denotes an N-channel MOS transistor having a first terminal connected to one end of a word line WL and having a second terminal connected to the stress voltage application terminal 22, and 25 denotes a control voltage application pad which is formed of a bonding pad and connected to the gates of the N-channel MOS transistors 24 and to which a control voltage VG is externally applied during the voltage stress test. None of the pads 22 and 25 for the voltage stress test are used in the normal operation mode. The N-channel MOS transistors 24 and control voltage application pad 25 constitute a stress voltage transmission circuit 23. When the stress voltage VS is not applied to the stress voltage application terminal 22, the stress voltage transmission means 23 is turned off. When the stress voltage VS is applied to the terminal 22, the circuit 23 transmits the stress voltage VS to a number of word lines WL which is greater than the number of word lines selected in response to the externally input address signal in the normal operation mode.

In this embodiment, a precharge type NAND gate is used as the word line selection circuit 13 and includes a precharging P-channel MOS transistor 31 and a group of internal address signal decoding N-channel MOS transistors 32 connected in series between a power supply potential Vcc and a ground potential Vss. A connection point of the P-channel MOS transistor 31 and the group of N-channel MOS transistors 32 is an output node 33. In the precharge type NAND gate, after a precharge signal PRCH is rendered at an active level "L" and the output node 33 is precharged to have a high level, if all input internal address signals are rendered at a high level, the signal (word line selection signal) of the output node 33 is decreased to a low level.

In this embodiment, the word line driving circuit 14 is connected between a word line driving voltage WDRV source (WDRV corresponds to potential to which power supply potential Vcc is boosted) and the word line WL, and comprises a word line driving N-channel MOS transistor 34 for driving the word line WL in response to the output signal of the word line selection circuit 13, a noise killer N-channel MOS transistor 26 connected between a end of the word line and the ground node, a first CMOS inverter 35 whose input terminal is connected to the output terminal of the word line selection circuit 13, a pull-up P-channel MOS transistor 36 connected between the power supply potential Vcc and the output terminal of the word line selection circuit 13 and having gate connected to the output terminal of the first CMOS inverter 35, an N-channel MOS transistor 37 connected between the output terminal of the first CMOS inverter 35 and the gate of the word line driving N-channel MOS transistor 34 and having a gate to which the power supply potential Vcc is applied, and a two-input NOR gate 38 for carrying out logical OR between an output of the first CMOS inverter 35 and a noise killer transistor control signal VA, described later, and supplying an output of the logical OR to the gate of the noise killer NMOS transistor 26.

In FIG. 1, a bit line potential control circuit 20 is used to control the potential of the bit line precharge power line 16 in the voltage stress test, and comprises an output switching circuit (e.g., CMOS transfer gate) 40 inserted between the output terminal of the bit line precharge voltage generation circuit 18 and the bit line precharge power line 16, a bit line potential control signal application pad 41 to which a bit line potential control signal VBLSW is externally applied in the voltage stress test and, if necessary, in a function test, and an output switch control circuit 43 for turning off the output switching circuit 40 to apply a bit line potential VBL from the bit line potential application pad 42 to the bit line precharge power line 16 in the voltage stress test and turning on the output switching circuit 40 in the normal operation mode.

The output switch control circuit 43 includes two CMOS inverters 44 and 45 connected to the bit line potential control signal application pad 41 and a resistive element 46 connected between the bit line potential control signal application pad 41 and a ground node.

An operation of the bit line potential control circuit 20 will be described. When no signals are supplied to the bit line potential control signal application pad 41, the potential of the pad 41 is pulled down to the ground potential by the resistive element 46, and an output of the CMOS inverter 44 on the prior stage becomes a high level and an output VA (bit line potential control signal) of the CMOS inverter 45 becomes a low level, thereby turning on the output switching circuit 40. When a high-level bit line potential control signal VBLSW is applied to the bit line potential control signal application pad 41, the output of the CMOS inverter 44 becomes a low level and the output VA (bit line potential control signal) of the CMOS inverter 45 becomes a high level, thereby turning off the output switching circuit 40.

The DRAM circuit shown in FIG. 1 further comprises a noise killer control circuit and a capacitor plate potential control circuit.

The noise killer control circuit turns off the noise killer MOS transistor 26 connected to the word line WL to which the stress voltage VS is applied in the voltage stress test. The noise killer control circuit is so constructed as to control the noise killer MOS transistor 26 using a signal for controlling the bit line potential control circuit 20. For example, the bit line potential control signal VA is supplied to the two-input NOR circuit 38 as a noise killer control signal.

The capacitor plate potential control circuit controls the potential of the capacitor plate in the voltage stress test, and comprises an output switching circuit (e.g., CMOS transfer gate) 47 inserted between the capacitor plate and the output terminal of the plate potential generation circuit 19, a plate potential application pad 48 to which a desired plate potential is externally applied in the voltage stress test, and an output switching control circuit for turning off the output switching circuit 47 to apply the plate potential from the plate potential application pad 48 to the capacitor plate in the voltage stress test and turning on the output switching circuit 47 in the normal operation mode. In this embodiment, the output switching control circuit corresponds to the output switching control circuit 43 of the bit line potential control circuit 20. The output switching circuit 47 can be controlled using a control signal which depends upon stress voltage VS applied to the stress voltage application pad 22 or voltage VG applied to the control voltage application pad 25.

An operation of the DRAM circuit shown in FIG. 1 will be described. In the normal operation mode, an output of the bit line precharge potential generation circuit 18 is supplied to the bit line precharge power line 16 through the output switching circuit 40 which is in an on state. If a row address strobe ($\overline{RAS}$) signal (not shown) is inactivated, a bit line precharge equalizing signal generation circuit (not shown) is activated to generate a precharging/equalizing signal VEQ. The bit line precharge circuit 15 and bit line equalizing circuit 17 are thus turned on to precharge and equalize all the bit line pairs BL and $\overline{BL}$ to have a predetermined bit line potential VBL. If the $\overline{RAS}$ signal is activated, the precharging/equalizing signal VEQ applied to the bit line of a selected memory cell block, is inactivated, and word line selection signals are output in accordance with a combination of logic levels of address signals, thereby selecting an selected number of word lines WL.

In the word line driving circuit 14 in a selective state to which the word line selection signal of active level "L" is supplied, the output of the first CMOS inverter 35 becomes high in level, and a connection node between one of drain terminals of the MOS transistor 37 and the gate of the N-channel MOS transistor 34 becomes high in level. The MOS transistor 34 is thus turned on to drive the word line WL to have a high level. The high-level output of the first CMOS inverter 35 makes an output of the two-input NOR circuit 38 low in level, and the noise killer transistor 26 is turned off. The pull-up P-channel MOS transistor 36 is turned off since its gate potential (corresponding to the output potential of the first CMOS inverter 35) is high.

In the word line driving circuit 14 in a non-selective state to which the word line selection signal of inactive level "H" is supplied, the output of the first CMOS inverter 35 becomes low in level, and the connection node between the one drain terminal of the MOS transistor 37 and the gate of the N-channel MOS transistor 34 becomes low in level. The MOS transistor 34 is thus turned off to render the word line WL in a non-selective state. The level of the noise killer control signal VA is low, the two-input NOR circuit 38 outputs a high-level signal, and the noise killer transistor 26 is turned on. The pull-up P-channel MOS transistor 36 is turned on since its gate potential (corresponding to the output potential of the first CMOS inverter 35) is low.

When the DRAM in the form of wafer is burned in, the DRAM is applied operation power, and rendered in a stand-by state by receiving the input $\overline{RAS}$ signal in an inactive state. The bit line precharge equalizing circuit (not shown) is activated to generate a precharge equalizing signal VEQ (or to generate the precharge equalizing signal VEQ in response to the control signals). All the bit line precharge circuits 15 and bit line equalizing circuits 17 are turned on. The stress voltage VS is then applied to the pad 22 by bringing a probe (not shown) of a probe card of a tester into contact with the pad 22, and the gate control voltage VG higher than VS + Vth (Vth is a threshold voltage of the MOS transistor 24) is applied to the pad 25, with the result that the MOS transistors 24 are turned on and desired voltage stress is applied to all the word lines WL (or word lines WL more than those selected in the normal operation mode). A high-level bit line potential control signal VBLSW is supplied to the pad 41 to turn off the output switching circuit 40, and a high-level noise killer control signal VA makes the output of the two-input NOR circuit 38 low to turn off the noise killer transistor 26.

Since a desired voltage (e.g., ground voltage Vss) is applied to the pad 42, the bit lines BL, $\overline{BL}$ are not rendered in a floating state; therefore, a desired voltage can be applied between the word lines WL and bit lines BL, $\overline{BL}$, that is, a desired voltage can be applied to the insulating films of the memory cell transistors 11.

As a result, the cell transistors 11 can be screened to expose latent defects in the wafers. The cell transistors 11 are rendered in triode action, a channel region is formed under the gate electrode, and stress is directly applied to the entire surface of the gate insulating film. Further, a stress test voltage is applied to the pads 22 and 25, and the activation rate of the word lines is higher than that in the normal operation mode of the finished devices, making it possible to greatly improve the efficiency of a voltage stress test for wafers. For example, in a 4M-bit DRAM, only four of 4096 word lines can be simultaneously selected in a conventional burn-in method, and all the word lines can be simultaneously selected in the embodiment of the present invention. The stress application efficiency of the word lines of the present invention can thus be improved 1000 to 2000 times as high as that of the word lines of the conventional device, and the stress application time of the present invention becomes 1/1000 to 1/2000 times as long as that of the conventional device, with the result that a screening of transfer gates of the memory cells to which a boosted voltage is applied can be greatly improved in efficiency.

If the output switching circuit 47 of the plate potential generation circuit 19 is turned off, a desired plate potential, e.g., a Vcc potential is applied to the pad 48, data "0" is written in a memory cell to set a storage node of the capacitor 12 at a value approximate to the Vss potential when the burn-in is performed, or if the Vss potential is applied to the pad 48 as a plate potential and data "1" is written in the memory cell to set the storage node of the capacitor 12 at a value approximate to the Vcc potential when the burn-in is performed, stress having a value approximate to Vcc — Vss potential can be applied to a capacitor insulating film.

Since the DRAM shown in FIG. 1 comprises the voltage stress test pad 22 and stress voltage transmission circuit 23, voltage stress can be applied in a direct-current fashion to all the word lines WL or a number of word lines WL which is greater than a number of word lines selected in the normal operation mode when the DRAM in the form of wafer is burned in, resulting in great improvement in efficiency of the burn-in. When the voltage stress is applied to the word lines WL, the noise killer control circuit turns off the noise killer transistor 26 connected to the corresponding word line WL. Therefore, no through current flows from the voltage stress application source to the ground node via the corresponding word line WL and noise killer transistor 26.

In the DRAM shown in FIG. 1, the noise killer transistor 26 is connected between the word line driving transistor 34 and the ground node at one end of the word line WL. However, the noise killer transistor 26 can be connected therebetween at the other end of the word line WL.

In the DRAM shown in FIG. 1, a single noise killer transistor 26 is connected between the word line WL and the ground node. However, a plurality of noise killer transistors can be connected in series or in parallel therebetween. If a plurality of noise killer transistors are connected in series, at least one of the noise killer transistors has only to be turned off in order to burn in the DRAM in the form of wafer. If a plurality of noise killer transistors are connected in parallel, all of them are turned off.

In the DRAM shown in FIG. 1, a single word line WL is selected by the word line selection circuit 13. However, a plurality of word lines WL (e.g., four word lines) can be selected by the word line selection circuit 13 and the word line driving voltage WDRV can be applied to the word line driving transistors 34 corresponding to the selected word lines WL.

In the DRAM shown in FIG. 1, the noise killer transistor 26 is controlled solely using a noise killer control signal VA. However, it can be controlled by a control signal obtained by carrying out logical AND between the noise killer control signal VA and stress voltage VS applied to the pad 22. In this case, when a function test for die sort is carried out, the control signal VBLSW is supplied to the bit line potential control signal application pad 41 to turn off the output switching circuit 40, but a desired bit potential VBL can be applied from the bit line potential application pad 42 to the bit line precharge power line 16, without controlling the noise killer transistor 26.

In the DRAM shown in FIG. 1, the noise killer control circuit and part of the bit line potential control circuit 20 are used in common to each other. However, the noise killer control circuit and bit line potential control circuit 20 can be arranged separately from each other. More specifically, a noise killer control signal application pad and a noise killer control circuit can be additionally arranged like the bit line potential control signal application pad 41 and the output switching control circuit 43, or the noise killer transistor can directly be controlled by a noise killer control signal applied to the noise killer control signal application pad, or the noise killer transistor can also be controlled by a control signal which depends upon the stress voltage VS applied to the pad 22 or the control voltage VG applied to the pad 25.

In the DRAM shown in FIG. 1, when the voltage stress test is carried out, the bit line potential control circuit 20 turns off the bit line precharge potential generation circuit 18 to apply the bit line potential VBL to the bit line precharge power line 16. However, the bit line potential control circuit 20 can turn off the circuit 18 to connect the power line 16 to a predetermined fixed potential terminal (e.g., Vss node).

Further, the plate potential generation circuit 19 can be turned off using a control signal depending upon the stress voltage VS applied to the pad 22 or the control voltage VG applied to the pad 25 or a control signal of the bit line potential control circuit 20, thereby connecting the capacitor plate to a predetermined fixed potential terminal.

In the above embodiment, the pads used for the voltage stress test are formed of bonding pads. When the burned in process of the DRAM in the form of wafer, the pads have only to be so constructed that the pads are brought into contact with a probe of the probe card and a voltage is applied thereto. When the burn-in process of the DRAM in the form of packaged DRAM chip, the pads have only to be so constructed that they can be connected to external wires when chips are packaged.

In the above embodiment, the pads used for the voltage stress test are formed on the respective chips of the wafer. When the DRAM in the form of wafer is burned in, at least one of the pads can be commonly used for a plurality of chip regions, and wires for connecting the pad and the chip regions can be formed on, for example, a dicing line region on the wafer.

In the above embodiment, the voltage stress test is carried out to perform the burn in. It is needless to say that the present invention is effective in carrying out the voltage stress test irrespective of acceleration of temperature.

Additional advantages and modifications w 11 readily occur to those skilled in the art. Therefore, the invention in its broader aspects is not limited to the specific details, and representative devices, shown and described herein. Accordingly, various modifications may be made without departing from the spirit or scope of the general inventive concept a defined by the appended claims and their equivalents.

What is claimed is:

1. A dynamic random access memory, comprising:
   a plurality of memory cells arranged in rows and columns;
   a word line connected to the memory cells in the same row;
   a bit line connected to the memory cells in the same column;
   a word line selection circuit for generating a word line selection signal in response to an address signal;
   a word line driving circuit, connected between a word line driving voltage source and said word line, for driving said word line in response to an output signal of said word line selection circuit;
   a noise killer circuit connected between said word line and ground potential;
   a voltage stress test terminal to which a stress voltage is externally applied during a voltage stress test;
   stress voltage transmission means, coupled to a first predetermined number of word lines and to the voltage stress test terminal for transmitting the stress voltage to the first predetermined number of word lines which is greater than a second predetermined number of word lines selected in response to the address signal during a normal operation mode when the stress voltage is applied to said voltage stress terminal and noise killer control means coupled to the noise killer circuit and responsive to a first control signal for turning off said noise killer circuit connected to said word line to which the stress voltage is applied during the voltage stress test.

2. The dynamic random access memory according to claim 1, further comprising a bit line precharge circuit connected between said bit line and a bit line precharge power line and controlled in response to a second control signal, and a bit line precharge voltage generation circuit for generating a bit line precharge voltage which is applied to said bit line precharge power line.

3. The dynamic random access memory according to claim 2, further comprising bit line potential control means for controlling a potential of said bit line precharge power line during the voltage stress test.

4. The dynamic random access memory according to claim 3, wherein the first control signal which controls said nose killer control means is one of a control signal of said bit line potential control means, a control signal depending on the stress voltage applied to said voltage stress test terminal, or a signal used by said stress voltage transmission means.

5. The dynamic random access memory according to claim 2, wherein the first control signal which controls said nose killer control means is one of a control signal of a bit line potential control means wherein the bit line potential control means is coupled to the bit line, a control signal depending on the stress voltage applied to said voltage stress test terminal, or a signal used by said stress voltage transmission means.

6. The dynamic random access memory according to claim 1, further comprising bit line potential control means, coupled to a bit line precharge power line and responsive to a third control signal, for controlling a potential of said bit line precharge power line during the voltage stress test, said bit line precharge power line coupled to the bit line.

7. The dynamic random access memory according to claim 6, wherein the first control signal which controls said noise killer control means is one of a control signal of said bit line potential control means, a control signal depending on the stress voltage applied to said voltage stress test terminal, or a signal used by said stress voltage transmission means.

8. The dynamic random access memory according to claim 1, wherein the first control signal which controls said noise killer control means is one of a control signal of a bit line potential control means wherein the bit line potential control means is coupled to the bit line, a control signal depending on the stress voltage applied to said voltage stress test terminal, or a signal used by said stress voltage transmission means.

9. The dynamic random access memory according to any one of claim 6 7 or 8, wherein during the voltage stress test, said bit line potential control means controls an output of a bit line precharge voltage generation circuit to be in an OFF-state for permitting an externally input bit line potential to be applied to said bit line precharge power line or for permitting said bit line precharge power line to be connected to a predetermined fixed potential terminal.

10. The dynamic random access memory according to claim 9, further comprising a plate potential generation circuit, coupled to a capacitor plate of a memory cell of the plurality of memory cells, for generating a plate potential which is applied to the capacitor plate of said memory cell, and plate potential control means, responsive to one of a control signal of said bit line potential control means, a control signal depending on the stress voltage applied to said voltage stress test terminal, or a signal used by said stress voltage transmission means, for controlling an output of the plate potential generation circuit.

11. The dynamic random access memory according to claim 10, wherein during the voltage stress test, said plate potential control means controls an output of said plate potential generation circuit to be in an OFF-state for permitting an externally input plate potential to be applied to the capacitor plate of said memory cell or for permitting said capacitor plate to be connected to a predetermined fixed potential terminal.

12. The dynamic random access memory according to any one of claims 6 to 4, further comprising a plate potential generation circuit, coupled to a capacitor plate of a memory cell of the plurality of memory cells, for generating a plate potential which is applied to the capacitor plate of said memory cell, and plate potential control means, responsive to one of a control signal of said bit line potential control means, a control signal depending on the stress voltage applied to said voltage stress test terminal or a signal used by said stress voltage transmission means, for controlling an output of the plate potential generation circuit.

13. The dynamic random access memory according to claim 12, wherein during the voltage stress test, said plate potential control means controls an output of said plate potential generation circuit to be in an OFF-state for permitting an externally input plate potential to be applied to the capacitor plate of said memory cell or for permitting said capacitor plate to be connected to a predetermined fixed potential terminal.

14. The dynamic random access memory according to any one of claim 3, 4 or 5, wherein during the voltage stress test, said bit line potential control means controls an output of the bit line precharge voltage generation circuit in an OFF-state permitting an externally input bit line potential to be applied to said bit line precharge power line or to connect said bit line precharge power line to a predetermined fixed potential terminal.

15. The dynamic random access memory according to claim 1, wherein said first control signal is produced in accordance with the stress voltage applied to said voltage stress test terminal.

16. The dynamic random access memory according to claim 1, wherein said first control signal is applied to said stress voltage transmission means.

17. The dynamic random access memory according to claim 1, further comprising a capacitor plate, a plate potential generation circuit for generating a plate potential applied to capacitor plates of said memory cells, and plate potential control means for setting potentials of said capacitor plates at desired values.

18. The dynamic random access memory according to claim 17, wherein said plate potential control means comprises a plate potential application pad connected to said capacitor plates, and to which a desired plate potential is externally applied during the voltage stress test, and an output switching circuit between an output terminal of said plate potential generation circuit and said capacitor plates, and an output switching control circuit for turning on said output switching circuit during a normal operation time, and turning off said output switching circuit during the voltage stress test in response to said first control signal which is applied to said output switching circuit during the voltage stress test.

19. The dynamic random access memory according to claim 17, wherein said plate potential control means comprises an output switching circuit between an output terminal of said plate potential generation circuit and said capacitor plates, and a control circuit for turning on said output switching circuit during a normal operation, and turning off said output switching circuit and connecting said capacitor said capacitor plates to a predetermined fixed potential terminal during the voltage stress test in response to said first control signal which is applied to said output switching circuit during the voltage stress test time.

20. The dynamic random access memory according to claim 1, further comprising a bit line precharge power line for applying a precharge voltage to said bit line, a bit line precharge voltage generation circuit for generating a bit line precharge voltage to be applied to said bit line precharge power line, and a bit line potential control means, connected to said bit line precharge power line, for setting a potential of said bit line precharge power line, for setting a potential of said bit line precharge power line at a desired value in response to said first control signal which is applied to said bit line potential control means during the voltage stress test.

21. The dynamic random access memory according to claim 20, wherein said bit line potential control means comprises a bit line potential application pad to which a bit line potential is externally applied during the voltage stress test, an output switching circuit between an output terminal of said bit line precharge voltage generation circuit and said bit line precharge power line, a bit line potential control signal application pad to which a bit line potential control signal is applied externally during the voltage stress test, an output switch control circuit for turning on said output switching circuit during a normal operation, and turning off said output switching circuit during the voltage stress test in response to said bit potential control signal which is applied to said output switch control circuit during the voltage stress test.

22. The dynamic random access memory according to claim 20, further comprising an output switching circuit between an output terminal of said bit line precharge voltage generation and said bit line precharge power line, a bit line potential control signal application pad to which a bit line potential control signal is applied externally during the voltage stress test, and a control circuit for turning on said output switching circuit during a normal operation time, and turning off said output switching circuit and connecting said bit line precharge power line to a predetermined fixed potential terminal during the voltage stress test in response to said bit line potential control signal which is applied to said control circuit during the voltage stress test.

23. The dynamic random access memory according to claim 20, further comprising a plate potential circuit for generating plate potential to be applied to said capacitor plates of said memory cells, and plate potential control means, connected to said capacitor, for setting potentials of said capacitor plates at desired values on the basis of a second control signal which is applied to said plate potential control means during the voltage stress test.

24. The dynamic random access memory according to claim 23, wherein said plate potential control means comprises a plate potential application pad to which a desired plate potential is applied externally during the voltage stress test, and an output switching circuit which is inserted between an output terminal of said plate potential generation circuit and said capacitor plates, and an output circuit for turning on said switching circuit during a normal operation, and turning off said output switching circuit during the voltage stress test time in response to a control signal of said bit line potential control means.

25. The dynamic random access memory according to claim 23, said plate potential control means comprises an output switching circuit between an output terminal of said plate potential generation circuit and said capacitor plates, and an output circuit for turning on said output switching circuit during a normal operation, and turning off said output switching circuit and connecting said capacitor plate to a predetermined fixed potential terminal during the voltage stress test in response to a control signal of said bit line potential control means.

* * * * *